April 17, 1945. A. W. PLENSLER Re. 22,634

CONTROL APPARATUS

Original Filed Nov. 17, 1941 2 Sheets-Sheet 1

Inventor:
Alexander W. Plensler
By Foorman L. Mueller
Att'y.

April 17, 1945. A. W. PLENSLER Re. 22,634

CONTROL APPARATUS

Original Filed Nov. 17, 1941 2 Sheets-Sheet 2

Inventor:
Alexander W. Plensler
By: Foorman L. Mueller
Atty.

Reissued Apr. 17, 1945

Re. 22,634

UNITED STATES PATENT OFFICE 22,634

CONTROL APPARATUS

Alexander W. Plensler, Chicago, Ill., assignor to Belmont Radio Corporation, Chicago, Ill., a corporation of Illinois Original No. 2,319,472, dated May 18, 1943, Serial No. 419,404, November 17, 1941. Application for reissue August 9, 1943, Serial No. 497,990

29 Claims. (Cl. 171—119)

This invention relates generally to a control unit for electrical apparatus and in particular to a tuning unit for radio apparatus.

In some of the prior art radio receivers having push button type tuning employing lever actuated control units there is generally required an escutcheon plate which is relatively large in a direction vertically of the radio cabinet to accommodate slots for permitting a vertical movement of the levers. In lever operated units, as well as some linearly operated tuning apparatus, the control or push button units must be spaced apart from each other to provide working room for adjusting the units or other means to predetermined settings. The escutcheon plate, therefore, may also be appreciably increased in a longitudinal direction. On the other hand, the most desirable structure normally, particularly for portable and table type receivers, is an escutcheon which is as small as possible. In still other types of tuning apparatus special adjusting tools are required, and considerable inconvenience is encountered whenever a control unit is to be adjusted.

Many of such prior tuning devices in addition to having objectionable features on the outside of the receiver cabinet had equally objectionable features on the inside. The inside structure, in many instances, occupied considerable vertical space within the receiver housing as well as extending over considerable space in depth and width. All of this inside and outside structure either necessitated a larger housing, or reduced the space available to other vital parts within a housing of the same general size.

It is an object of this invention, therefore, to provide improved control apparatus for radio devices and the like controllable mechanism.

A further object of this invention is to provide a preassembled radio control unit the lateral and vertical dimensions of which are defined substantially by its associated finger operated portion or push button on the outside of the unit.

Yet another object of this invention is to provide compact simple push button operated inductance tuning mechanism which occupies a minimum of space at the front of and within a receiver housing so as to permit a small housing, or if desired, a larger housing in which ample room is available at the front for decorative effects, and within for easy simple assembly of all desirable parts.

Another object of the invention is to provide a control unit with adjustable means in which pivoted actuating means for releasing and locking the adjustable means is pivotally movable in a vertical plane longitudinally of the control unit and within the confines of its fixed vertical dimension.

A further object of this invention is to provide a preassembled tuning unit for radio apparatus including a plurality of control units, which is compact in assembly, rugged in construction, efficient in operation, and having the adjustable means for the control units capable of being simply adjusted without requiring any special tools or working space about the control units.

A feature of this invention is found in the provision of a tuning unit of a preassembled construction including a plurality of control units, frequency changing means, and means operatively connecting the frequency changing means and control units, which are all supported and operated in common frame means in a manner to extend a minimum distance in a vertical direction.

A still further feature of this invention is found in the provision of a preassembled tuning unit for a radio which is capable of being installed in a minimum of space within the radio cabinet to provide for a relative arrangement of the other radio parts within the cabinet such that the control parts on the cabinet front panel can be positioned in an attractive and pleasing pattern.

Another feature of this invention is the provision of a plurality of manually operated units within the control apparatus which can be reset to predetermined control positions by mere vertical movement within the confines of the push buttons themselves for locking and unlocking operations, and then mere linear movement in a restricted longitudinal path, so that no extra tools are required and the push buttons may all be spaced close together in a transverse direction over the front of the apparatus.

Further objects, features and advantages of this invention will become apparent from the following description when taken in connection with the accompanying drawings in which.

In practicing this invention there is provided a tuning unit of a preassembled construction, which is adapted to be mounted below or on the bottom of the chassis of a radio receiver without appreciably increasing the over all height of the receiver. The tuning unit includes frame means for slidably supporting a plurality of control units each of which includes a push button and related portions, and all such units operating on flat link members for driving iron cores in inductance units which are secured to the same frame means in a position extending longitudinally of the tuning unit and below the control units. The core elements for the inductance units are movable with a cable operatively connecting a pair of driven pulleys rotatably supported on the frame means and within the vertical space occupied by the inductance units. Each control unit occupying a minimum of vertical space, includes a carriage or body portion supporting an adjustable means, and locking means therefor including an actuating lever pivotally supported on the body member for pivotal movement in a vertical direction substantially within the confines of a corresponding push button for the control unit. Such lever has a portion thereof projecting outwardly from the push button which is manipulated and operates through intermediate means to lock and unlock the adjustable means without movement in any direction for the control unit as a whole.

In addition to operating the locking mechanism of a control unit, each lever, on an unlocking stroke serves to eject the call letter card from the button, to make way for a new call letter corresponding to the station to which the control unit is to be set. The lateral and vertical dimensions of each control unit is defined substantially by the corresponding dimensions of an associated push button, so that the spacing of the push buttons side by side longitudinally of the tuning unit determines the operating space for the control units. The control units may thus be compactly arranged in close adjacence to each other without in any way impairing the accessibility to the actuating lever for adjusting purposes.

Figure 1:
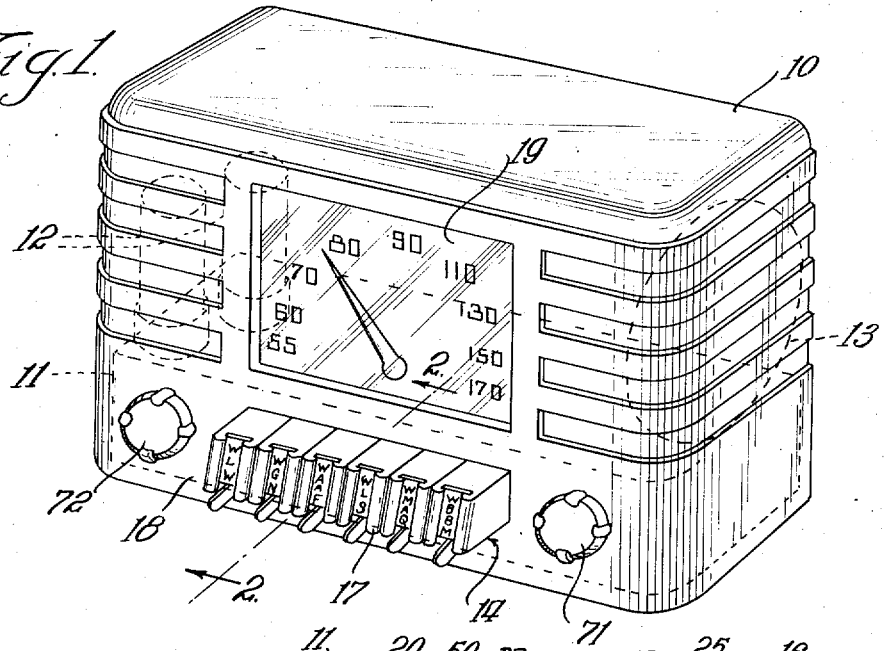
Fig. 1 is a front perspective view of a portable radio receiver showing one arrangement of the tuning unit of this invention therein.
Figure 2:
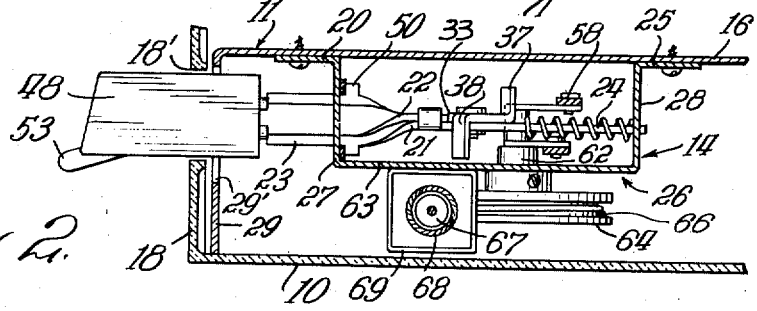
Fig. 2 is a transverse sectional view of a control unit as seen along the line 2—2 in Fig. 1.
Figure 3:
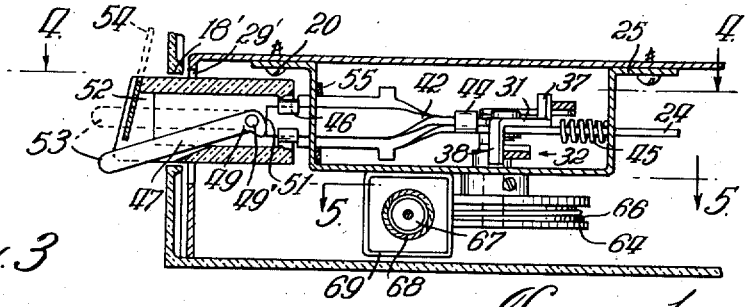
Fig. 3 is illustrated similarly to Fig. 2 and shows parts thereof in a changed position.
Figure 4:
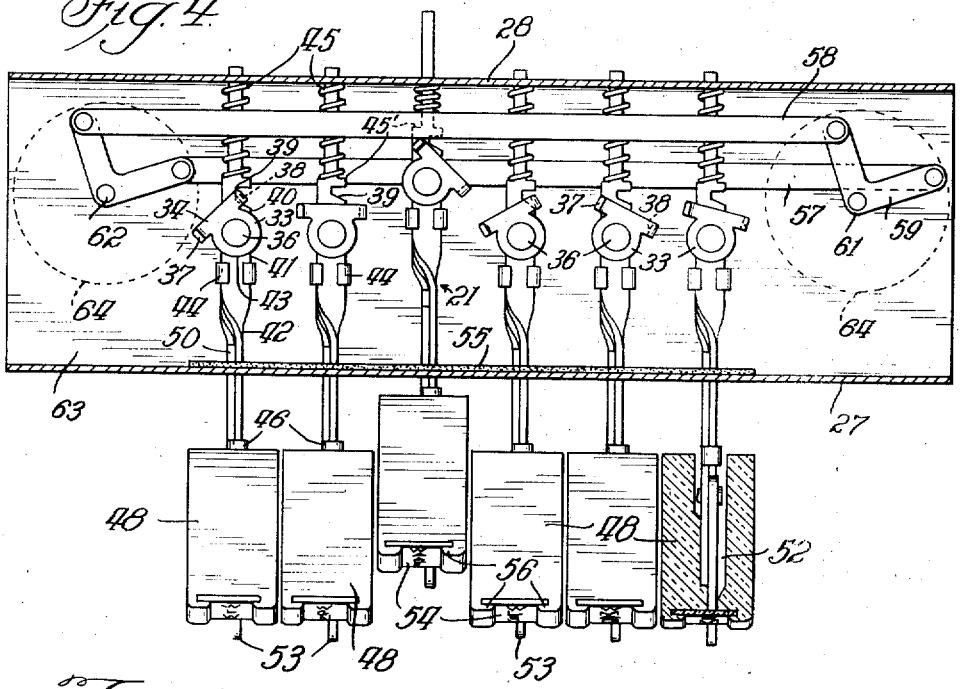
Fig. 4 is a plan view partly in section taken along the line 4—4 in Fig. 3 and showing the relative assembly of a plurality of control units.

With reference to the drawings there is shown in Fig. 1 a radio receiver of portable type having a cabinet 10 and a chassis 11 for carrying the usual tubes 12 and loud speaker 13. The tuning unit of this invention is designated generally as 14 (Figs. 1 and 2) and is supported from the longitudinal table portion 16 of the chassis 11, with the control units 17 thereof extending outwardly of the cabinet front panel 18 from below the dial face 19. As shown in Figs. 2, 3, and 4, each control unit 17 includes a body or supporting member 21, or carriage means, or carriage member as it is also called, of substantially flat form which is twisted about a quarter of a turn at 22 substantially intermediate its ends so that the end portions 23 and 24 thereof are substantially normal to each other. Each body member 21 is slidably supported in a U-shaped frame member 26, the end portions 23 and 24 being inserted through openings in the opposite leg portions 27 and 28, respectively, with the end portion 24 positioned in a plane longitudinally of the frame member 26. The free ends 20 and 25 of the leg portions 27 and 28, respectively, are secured to the underside of the platform 16 of the chassis 11.

Since all of the control units 17 are of a similar construction only one thereof will be referred to in the following description. The portion 24 (Figs. 3 and 4) of the body member 21 is provided with adjustable means 31 operatively engageable with movable control means, designated generally as 32, for frequency changing means 69 as will be later described. The adjustable element 31 includes a flat circular hub portion 33 integrally formed with a straight cross portion 34 and is pivotally supported on the body member 21 by axis means 36 extended through the hub portion 33 and the body member. The cross portion 34 is integrally formed with oppositely extending ears or stops 37 and 38. As seen in Fig. 2 the hub portion 33 extends in a plane longitudinally of the frame 26 with the stops 37 and 38 extending in opposite directions vertically of a corresponding control unit 17 and to each side of the body member end portion 24. The pivotal movement of the adjustable means 31 in one direction is defined by the engagement of the portion 38 with the bottom of a recess 39 in the side 40 of the body member 21, while its pivotal movement in an opposite direction is defined by the engagement of the stop 38 with a point 41 of side 40 of the body member.

Retention of the adjustable means 31 in an adjusted position corresponding to a predetermined tuned position of the frequency changing means 69 is accomplished by locking means including a member 42. The member 42 (Figs. 3 and 4) is of substantially flat form and of mating contour with the body member 21 for side by side assembly therewith. The body member 21 is integrally formed at the portion 24 thereof with bent ears 44 and at the portion 23 with bent ears 46 adapted to guidably support the locking member 42 for longitudinal slidable movement relative to the body member 21. The end 43 of the locking member 42 is of an arcuate shape corresponding to the hub portion 33 of the adjustable means 31 and frictionally engageable therewith to lock the adjustable means in an adjusted position.

To move the locking member 42 into a locking position with the adjustable means 31 there is provided an actuating lever 47 pivotally supported at its end 49 on axis means 49′ carried by the body member 21 at the portion 23 thereof. The axis means 49′ is positioned normal to the plane of the end portion 23 of the body member 21, and hence transversely of the control unit 17, so that its pivoted movement in actuating the locking member 42 is in a vertical direction longitudinally of the control unit. As illustrated in Fig. 3 the lever end 49, which is of cam shape, is locked with the end 51 of the locking member 42, to in turn lock the adjustable means 31 in an adjusted position, it being apparent that the member 42 is slidably moved relative to the member 21 to its locking position by virtue of the cam action of the lever end 49 when the lever 47 is pivotally moved vertically downwardly. To release the adjustable means 31 the lever 47 is simply moved vertically upwardly to a position in substantial alignment with the longitudinal axis of the control unit 17, as indicated in dotted lines in Fig. 3. This movement releases the cam end 49 from the end 51 of the locking member which in turn permits the adjustable means 31 to pivot freely about axis means 36.

On locking of the adjustable means 31 in an adjusted position the members 21 and 42 are locked against relative movement and slidably movable in the frame member 26 as a unit. Movement of the control unit to a tuning position is accomplished by manually pushing on a finger portion or push button 48, to be described, against the pressure of a spring 45 arranged in compression about the body portion 24 between a shoulder 45′ thereon, and the leg portion 28 of the frame member 26. On release of the push button 48 the control unit 17 is returned to its rest or idle position defined by engagement of stop portions 50 integral with the body member portion 23 with a bumper member 55 on the leg portion 27 of the frame member 26.

The push button 48, now to be described, is of a hollow construction, mounted on the end portion 23 of the body member 21 and extended through openings 29' and 18' provided in the supporting leg portion 29 of the chassis 11 and front cabinet panel 18, respectively. The actuating lever 47 is substantially completely positioned within a cavity 52 in the push button 48 with only its finger operated end 53 extending outwardly from the push button between guide ways 56 for slidably supporting a station tab or indicating means 54. A tab 54 is thus removable from a corresponding push button 48 by merely sliding it in a vertical direction upwardly of the push button. When it is desired, therefore, to adjust the adjustable means pivotal movement of the lever 47 vertically upwardly to its releasing position engages the bottom of a corresponding tab 54 to concurrently remove such tab from its corresponding push button as indicated in dotted lines in Fig. 3. The new tab corresponding to the new adjusted position of the adjustable means 31 may thus be inserted directly after the lever 47 is moved to its locking position.

It is evident from Fig. 3 that the entire vertical pivotal movement of the actuating lever 47 from its full line to its dotted positions corresponding to the locked and released condition of the adjustable means 31 is entirely within the vertical dimensions of the push button 48. This vertical dimension of the push button 48 defines substantially the vertical height of the frame member 26 and the vertical dimension of the control unit 17. Also with reference to Fig. 4 it is seen that the dimension of the push button 48 in a lateral direction defines the lateral dimensions of a corresponding control unit. By virtue of this relative construction and assembly of each control unit 17 they may be arranged side by side adjacent to each other without requiring space between adjacent units to accommodate actuating means for the adjustable means, or working space for screw drivers or the like sometimes used in the setting of the adjustable means. The space required to receive a control unit in the front panel of a radio cabinet is thus determined by the vertical and lateral dimensions of a corresponding push button.

Figure 5:
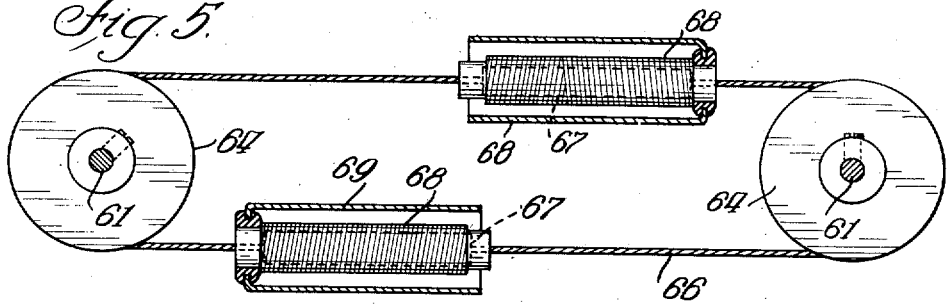
Fig. 5 is a plan view as seen along the line 5—5 in Fig. 3 showing the assembly of the inductance units in the tuning unit of this invention; and, Fig. 6 is a fragmentary sectional view of a modified form of the invention.

The control means 32, previously mentioned, includes a pair of spaced parallel members 57 and 58 extending longitudinally of the frame member 26, and hence of the tuning unit 14, and positioned within the frame member 26. The members 57 and 58 are connected together for concurrent relative movement by a crank arm 59 mounted on the upper end of a pair of spaced axes means 61 rotatably supported in bearings 62, and extending through the bottom or leg connecting portion 63 of the frame member 26. The connecting members 57 and 58 (Figs. 2 and 3) are positioned entirely within the confines of the frame 26 and lie in different longitudinal planes to provide for the engagement of the connecting member 57 with the stops 38, and the engagement of the member 58 with the stops 37 of the adjustable means 31. The lower end of each axes means 61, which extends outwardly from the base portion 63 has mounted thereon a pulley 64 (Figs. 3 and 5).

The pulleys 64 are operatively connected together for concurrent rotation by a cable 66 having a core or slug member 67 connected in each cable length extending between the pulleys 64. Each core 67 is operatively associated with a corresponding coil 68 of an inductance unit 69, the inductance units or frequency changing means 69 being arranged longitudinally of the tuning unit 14 and secured to the underside of the frame portion 63. On rotation of the pulleys 64, therefore, the cable 66 between the pulleys is linearly moved, to in turn linearly adjust the cores 67 relative to their corresponding coils 68 to provide for a tuning position of the inductance units 69 corresponding to a desired setting of a control unit 17. From a consideration of Fig. 2 it is seen that the pulleys 64 are rotatable in a plane longitudinally of the tuning unit 14 and within the confines of the vertical dimension of the inductance units 69. The vertical dimension of the tuning unit 14 is thus defined substantially by the combined vertical dimensions of a push button 48 and inductance unit 69.

In the operation of a control or selector unit 17 to move the control means 32 to a control position corresponding to a preselected tuning position of the inductance units 69, let it be assumed that the adjustable means 31 is locked in an adjusted position and that the stop portions 37 and 38 thereof are positioned as shown in Figs. 2 and 3. On initial movement of the control unit toward a tuning position or to the right as viewed in Figs. 2 and 3 the stop portion 37 engages the control member 58, to move it toward the right as also viewed in Figs. 2 and 3. By virtue of the assembly of the crank arms 59 with the connecting members 57 and 58 this movement of the connecting member 58 concurrently moves the connecting member 57 toward the left, as seen in Figs. 2 and 3. This operation of the control unit 17 continues until the control member 57 engages the stop portion 38, the engagement of the stop portions 37 and 38 with corresponding connecting members 58 and 57 defining a control position for the control means 32. Since rotation of the crank arms 59 in turn rotates the axes 61 the pulleys 64 are rotated to adjustably move the cores 67 relative to their corresponding coils 68 to a tuning position corresponding to the defined control position of the control means 32. It is evident, therefore, that the pulleys 64 are rotated directly in response to a movement of the connecting members 57 and 58 with a locked position of the members 57 and 58 with an actuated control unit 17 defining a predetermined tuning position of the inductance units 69.

In the setting of the adjustable means 31 in an adjusted position the actuating lever is first moved to its releasing position. A tuning knob 71 (Fig. 1), which is operatively associated by suitable means (not shown) with one of the axes 61 is then manually rotated to a tuning position and retained in such desired tuning position while the control unit is operated as for normal tuning. With the connecting members 57 and 58 held fixed through their connection with the axis 61 the adjustable means 31 is rotated until the stop portions 37 and 38 thereof are in engagement with corresponding connecting members. When this engagement occurs the actuating lever 47 is moved pivotally downwardly to in turn move the locking member 42 into its locking position with the adjustable means 31, as was fully described above. The setting of each control unit 17 to tune in a desired station is thus very conveniently accomplished by the simple actuation of the lever 47 directly at the front of a corresponding push button 48, and operating the control unit in a manner usual for tuning.

In radio receivers and particularly in portable receivers the push buttons and the frequency changing means occupy a relatively large space vertically of the receivers so as to require their being positioned to one side or the other of the dial face 19 in the radio front panel. Thus in portable receivers it was necessary generally to have the dial face positioned to one side of the radio cabinet to accommodate the tuning means at the other side thereof. With the control units 17 slidably supported in the frame member 26, and the inductance units 69 and control means 26 operatively mounted on the frame 26, the tuning unit 14 is adapted to be completely preassembled as a unit before its assembly to the portion 16 of the radio chassis 11. Because of this compact unit assembly of the tuning unit 14 the complete tuning unit may be accommodated in a very minimum of space vertically of the radio cabinet so as to be conveniently arranged in a position centrally of the front cabinet panel 18 and in vertical alignment with the dial face 19, as is illustrated in Fig. 1. Since the dimensions of the control units are defined laterally by the corresponding dimensions of the push buttons 48, the push buttons may be arranged side by side in substantial sliding engagement with each other without in any manner impairing the efficient operation of the control units. Since the over all operating movement of the actuating lever is entirely within the confines of the vertical dimension of the push button the convenience and ease with which the adjustable means 31 are set is positively retained. The control units may, therefore, be positioned substantially entirely below dial face 19, with the usual manual tuning control 71 and the volume and "off and on" control 72 arranged to each side of the control units. The dimensions of the cabinet can thus be retained unchanged while providing for an even pattern or arrangement of the control parts on the front panel 18 thereof. The compact assembly of the tuning unit 14 with its smallest dimension in a vertical direction thus serves to improve the over all neatness and appearance of the radio receiver.

Figure 6:
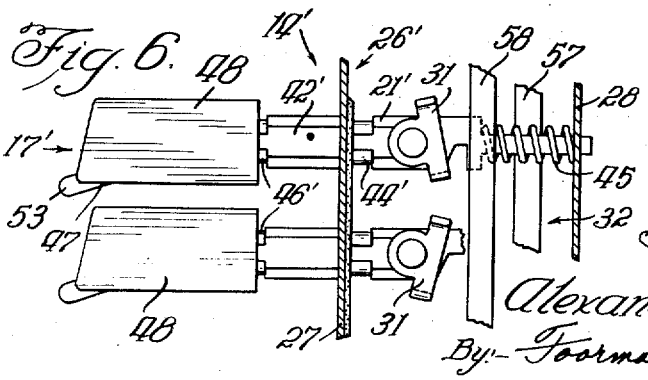

A modified form of the invention is shown in Fig. 6 with the control units 17' arranged in superposed positions as where the invention is utilized in an automobile receiver. In automobile receivers it is generally desirable to have the push buttons arranged in a superposed relation to provide for their compact assembly transversely of the usual dash board and in close proximity to the operator of the automobile. It is further desirable that the tuning mechanism be of a minimum dimension laterally of the dash board so as to be entirely accommodated within the space provided thereby without interfering with the usual control equipment and instruments carried on the automobile dash.

The tuning unit 14' in Fig. 6 is substantially similar in all respects to the tuning unit 14, previously described, and similar numerals of reference will be used, therefore, to designate similar parts. Each control unit 17' includes a flat body member 21' of straight form over its entire length. A locking member 42' also of flat form and straight over its entire length is slidably supported on the body member 21' for relative movement longitudinally thereof by the bent ear portions 44' and 46' integrally formed with the body member 21'. The control units 17' are slidably supported in the leg portions 27 and 28 of the frame member 26 for moving the control means 32 to predetermined control positions. The adjustable means 31 is adapted to be locked in an adjusted position by an actuating lever 47 operatively connected therewith through the locking member 42' in a manner similar in all respects to the corresponding parts previously described in connection with Fig. 2.

The lateral and vertical dimensions of a control unit 17' are defined substantially by the corresponding dimensions of a push button 48, with the actuating lever 47 being pivotally movable substantially entirely within the confines of the vertical dimension of a corresponding push button 48. Because of this relative construction the control units 17' are capable of being arranged in a superposed relation in a direction longitudinally of the frame 26 and in substantial adjacence to each other for engaging the control means 32. With the control units 17' in a superposed relation the utilization of a body member 21' and a corresponding locking member 42' of flat straight form over their entire lengths provides for a very minimum length in a direction longitudinally of the control unit and for a movement of the connecting members 57 and 58, the adjustable means 31 and actuating lever 47 in parallel planes extending longitudinally of the tuning unit 14'. With the movement of these parts in planes longitudinally of the control unit 14' the lateral depth of the unit is retained at a minimum dimension, while the vertical dimension is determined essentially by the number of control units 17' desired. The tuning units 69 and cooperative pulleys 64, as fully described in connection with Fig. 2, are similarly relatively assembled to the frame 26 of the modification in Fig. 6. By virtue of this construction a compact unit extended longitudinally in a vertical direction, and having its smallest dimension in a lateral direction is provided for vehicle installations. It is to be understood, however, that the invention in Fig. 6 may also be used whenever a vertical arrangement of the control units in a minimum of space is desired for home and portable receivers.

From a consideration of the drawings and description it is seen that the invention provides a completely preassembled tuning unit including control units, tuning means and movable control means operatively connecting the control units and tuning means, which is adapted for assembly at the bottom portion of a usual radio chassis to occupy a minimum of space in a direction vertically of said chassis, or at some vertical position within the complete receiver apparatus so as to occupy a very small space transversely of the cabinet as illustrated in Fig. 6. The push button mechanism for the individual control units is integrally assembled in the corresponding control unit with its operating positions being entirely confined within the dimensions vertically of a corresponding control unit. Locking and unlocking of adjustable means in each control unit is likewise accomplished substantially within such dimensions, by lever means operating merely by thumb or finger while the remainder of the control unit is stationary.

It is to be understood further that although the invention has been described with reference to several specific embodiments thereof that it is not to be so limited, since alterations and modifications can be made therein which are within the full intended scope of this invention as defined by the appended claims.

I claim:

1. In a tuning structure for a radio set, a push button slidable structure including a finger portion and an adjustable setting device, the said structure having two parts slidably interconnected, and a pivoted lever pivotally connected with one part and adapted to act on the other part to place said other part in locking engagement with said setting device, said lever being pivotally movable within said finger portion.

2. In a tuning structure for a radio set, a push button slidable structure including a plurality of parts with one of said parts carrying a push button and an adjustable setting device, and means including at least another part of the slidable structure for locking said setting device in an adjusted position and including a portion pivoted on said one part and adapted to be pivotally moved in a vertical direction for acting on said another part of said means to release and lock said setting device, with said pivotal portion being pivotally movable substantially within the vertical confines of said push button.

3. In a tuning device for a radio set, a selector slide structure carrying a push button and adjustable means, a member for locking said adjustable means in an adjusted position, and a member pivoted on said slide structure for pivotal movement within said push button, and adapted on manual pivotal movement for operating said locking member so as to release or lock said adjustable means.

4. A control unit for controllable apparatus including a first member having adjustable means pivoted at one end thereof, means for locking said adjustable means in an adjusted position including a second member carried on said first member, means supporting said second member for linear slidable but non-rotatable movement relative to said first member, and an actuating lever having one end pivoted at the other end of said first member, with said one lever end and adjustable means being operatively connected together through said second member so that pivotal movement of said lever in one direction slidably moves said second member into locking engagement with said adjustable means.

5. A control unit for radio apparatus having a first member with adjustable means carried at one end thereof, a finger gripping portion at the opposite end of said first member, means releasably locking said adjustable means in an adjusted position including a lever movable within said finger portion, means pivotally supporting said lever at one end on the opposite end of said first member, with the other end of said lever extending outwardly from said finger portion to provide for the manipulation of said lever, a second member operatively associated with said adjustable means and one lever end, and means supporting said second member on said first member for movement relative thereto, said one lever end on pivotal movement of said lever acting on said second member for locking and releasing said adjustable means.

6. A control unit for radio apparatus having a body member with adjustable means pivotally supported at one end thereof, a finger gripping portion carried on said body member at the opposite end thereof, means for locking said adjustable means in an adjusted position including a locking member having one end movable into frictional engagement with said adjustable means to lock the same, means on said body member slidably supporting said locking member for movement relative thereto, and an actuating lever pivotally supported on the opposite end of said body member and movable within said finger gripping portion, said lever having one portion operatively connected with the other end of said locking member and a second portion thereof projecting outwardly from said finger portion to provide for the pivotal manipulation of said actuating lever, said second portion being pivotally movable substantially within the confines of said finger gripping portion, and said one portion on pivotal movement of said lever acting on said locking member to release and lock said adjustable means.

7. A control unit for radio apparatus including a longitudinally extending body member, adjustable means carried at one end of said body member, means for releasably locking said adjustable means in an adjusted position including a longitudinally extending slide member having one end thereof movable into frictional engagement with said adjustable means, means guidably supporting said slide member on said body member for relative longitudinal but non-rotatable movement into and out of frictional locking engagement with said adjustable means, and pivotally movable actuating means pivotally supported on said body member at the opposite end thereof and operatively connected with the other end of said slide member, with said actuating means on pivotal movement thereof acting on said slide member to release and lock said adjustable means.

8. A control unit for radio tuning apparatus including a longitudinally extending first member having adjustable means supported at one end thereof, a finger gripping portion with a cavity therein mounted at the opposite end of said first member, an actuating lever having one end pivotally supported at the opposite end of said first member, said lever being located within the cavity in said finger portion with the other end thereof projecting outwardly from said finger portion to provide for the manipulation of said lever, means for locking said adjustable means in an adjusted position including a second longitudinally extending member operatively associated with said adjustable means and one lever end and carried on said first member between said adjustable means and one lever end, and means on said first member slidably supporting said second member for longitudinal but non-rotatable movement relative thereto, said one lever end on pivotal movement of said lever in one direction engaging and moving said second member relative to said first member into frictional locking engagement with said adjustable means, with the pivotal movement of said lever being substantially completely within the confines of said finger portion.

9. A control unit for radio tuning apparatus including a body member, pivoted adjustable means at one end of said body member, a finger gripping portion at the opposite end of said body, with the vertical height of said finger portion defining the vertical height of said control unit, means for frictionally locking said adjustable means in an adjusted position including a member slidably carried on said body member substantially between said finger portion and adjustable means, means guidably supporting said slide member for movement relative to said body member into and out of frictional engagement with said adjustable means, a pivoted actuating member movable within said finger portion, and means pivotally supporting said actuating member at one end on the opposite end of said body member for pivotal movement in a direction vertically of said control unit, said one end being operatively connected with said slide member to move the same relative to said body member into locking position with said adjustable means when said actuating member is pivotally moved in one direction, and the other end of said actuating member being extended from said finger portion to provide for the manipulation of said actuating member, with said actuating member being pivotally movable substantially within the vertical height of said finger portion.

10. A control unit for radio apparatus including a member having adjustable means at one end and a finger operated portion at the other end thereof, means for locking said adjustable means in an adjusted position including a second member slidably supported on said first member in operative association with said adjustable means, means guidably supporting said second member for linear but non-rotatable movement relative to said first means and into and out of frictional locking engagement with said adjustable means, an actuating lever pivotally supported at the other end of said first member and operatively connected with said second member, said actuating lever being movable within said finger portion to move said second member into locking engagement with said adjustable means, with the pivotal movement of said lever being substantially entirely within the confines of said finger portion, and the vertical and lateral dimensions of said finger portion defining the corresponding dimensions of said control unit.

11. A control unit for radio apparatus including a body member having adjustable means movably supported at one end thereof, a finger gripping member supported at the other end of said body member having an opening therein, indicating means slidably supported in said finger member for movement vertically of said finger member, means for locking said ajustable means in an adjusted position corresponding to the indication on said indicating means including a locking member, means movably supporting said locking member on said body member for movement relative thereto into and out of frictional locking engagement with said adjustable means, a pivoted lever movable within the opening in said finger member and operatively connected with said locking member, and means pivotally supporting said lever on said body member for pivotal movement vertically of said finger member, said lever on pivotal movement in one direction acting on said locking member to move the same into a locking position with said adjustable means, with pivotal movement thereof in an opposite direction permitting said locking member to be moved out of said locking position, said lever having a portion thereof arranged in the path of the vertical movement of said indicating means so that said lever on pivotal movement thereof in said opposite direction engages and pushes said indicating means from said finger member.

12. In control apparatus having movable control means, a control unit for moving said control means to a predetermined control position including a flat longitudinally extending member twisted substantially intermediate its ends so that the end portions thereof are substantially normal to each other, means slidably supporting said body member with one of said end portions positioned in a vertical plane, adjustable means pivoted on the other end portion of said body member for operatively engaging said control means, means pivotally supporting said adjustable means for pivotal movement in a plane normal to said vertical plane, a second flat longitudinally extending member of mating contour with said first flat member, means movably supporting said second member on said first member for longitudinal movement relative thereto into and out of frictional locking engagement with said adjustable means, pivoted means at the other end of said first member in operative connection with said second member, means pivotally supporting said pivoted means for movement in a vertical plane, said pivoted means on pivotal movement thereof acting on said second member to control the movement thereof relative to said first member, and a finger gripping portion supported on the one end portion of said first member, with the lateral and the vertical dimensions of said finger portion defining the lateral and vertical dimensions of said control unit, and the pivotal movement of said pivoted means being confined substantially within the vertical dimension of said finger portion.

13. In control apparatus having movable control means, a control unit for moving said control means to predetermined control positions including a longitudinally extending flat member with pivoted adjustable means at one end and a finger portion supported at the other end thereof, means pivotally supporting said adjustable means for pivotal movement in a plane parallel with the longitudinal plane of said flat member and vertically of said control unit, an actuating lever pivoted at the other end of said first member, means pivotally supporting said lever for pivotal movement in a plane parallel with the longitudinal plane of said flat member, and a second flat member slidably supported on said first flat member for longitudinal movement relative thereto, and operatively connecting said actuating lever and adjustable means, with pivotal movement of said actuating lever acting on said second flat member to move the same into locking engagement with said adjustable means to hold the same in an adjusted position, the lateral and vertical dimensions of said control unit being defined substantially by the corresponding dimensions of said finger portion, and the pivotal movement of said actuating lever being substantially confined within the vertical dimension of said finger portion.

14. Electrical control apparatus having movable control means, a longitudinally extending movable control unit including a supporting member having adjustable means pivoted thereon, said adjustable means having a pair of oppositely arranged engaging portions, means carried by said supporting member for releasably locking said adjustable means in a position corresponding to a predetermined control position of said control means, said control means including a pair of parallel longitudinally extending connecting members corresponding to said engaging portions, said control unit being arranged normal to said connecting members so that movement thereof in one direction operatively connects said engaging portions and connecting members, and means connecting said connecting members together for concurrent opposite movement in a direction laterally thereof, with movement of said control unit towards said connecting members moving one of said engaging members to move said control means to a predetermined control position which is defined when the other engaging portion engages its corresponding connecting member.

15. A preassembled tuning unit for radio control apparatus having a cabinet, adapted to be installed in a space having the smallest dimension thereof vertically of said cabinet and including a plurality of control units, frame means slidably supporting said control units in a side by side relation longitudinally of said tuning unit, each of said control units having adjustable means at one end and a finger operated portion at the other end thereof, with the vertical and lateral dimensions of said finger portion defining the corresponding dimensions of a control unit, inductance tuning means including coil members longitudinally arranged on said frame means and secured thereto below said control units with the combined vertical dimensions of a finger portion and coil substantially defining the over all vertical height of the tuning unit, pulleys rotatably supported on said frame means for rotation in a plane longitudinally thereof, said pulleys being positioned below said control units within a vertical space defined by said frame means and secured thereto below said pulleys, core elements for said coil members connected into said cable, with movement of said cable adjusting the coil elements relative to said coils, means operatively connecting the adjustable means on said control units with said pulleys so as to rotate said pulleys on actuation of a control unit, and means movably supporting said connecting means on said frame means, with said connecting means being arranged substantially within a vertical distance defined by the vertical dimension of said finger portion.

16. A preassembled tuning unit of push button type including longitudinally extending frame means for slidably supporting a plurality of control units in a side by side relation longitudinally thereof, each of said control units having a body member with adjustable means at one end and a push button at the other end thereof having a cavity therein, with the vertical height and width of a control unit being defined substantially by the corresponding dimensions of a push button, means for locking said adjustable means in an adjusted position operatively supported on said body member and including a pivoted actuating lever movable within the opening of a corresponding push button, means supporting said lever for pivotal movement within the vertical dimension of said push button, with said lever on pivotal movement thereof acting on said locking means to release and lock said adjustable means, frequency changing means supported from said frame means adjacent said control units so that the over all dimension of said tuning unit transversely thereof is defined substantially by the dimensions of said frequency changing means and push buttons in a direction transversely of said tuning unit, and means supported on said frame means operatively connecting said frequency changing means with said adjustable means.

17. In a preassembled tuning unit for radio control apparatus constructed so as to have its smallest dimension in a direction transversely thereof and including longitudinally extending frame means, a plurality of control units slidably supported in said frame means in a superposed relation longitudinally thereof, each of said control units having a body member with adjustable means at one end, a push button at the other end of said body member having a cavity therein, with the vertical height and width of a control unit being defined substantially by the corresponding dimensions of a push button, means for locking said adjustable means in an adjusted position operatively supported on said body member and including a pivoted actuating lever movable within the opening of a corresponding push button, means supporting said lever for pivotal movement in a vertical direction and within the vertical dimension of said push button, with said lever on pivotal movement thereof acting on said locking means to release and lock said adjustable means, frequency changing means supported from said frame means to one side of said control units, so that the over all dimension of said tuning unit in a transverse direction is defined substantially by the width of said push buttons and the dimension of said frequency changing means in a direction transversely of said tuning unit, and means supported on said frame means operatively connecting said frequency changing means with said adjustable means, said latter means being positioned at the one end of said body member and within the transverse dimension of said tuning unit.

18. In a control unit having one part with adjustable means and push button means thereon, a linearly movable part carried on said one part for releasably locking said adjustable means in an adjusted position, and a finger operated portion connected with said linearly movable part to linearly move the same relative to said adjustable means, said finger operated portion being movable within said push button means and having an operating movement defined substantially by a dimension of said push button means transversely of said control unit.

19. In a tuning structure for a radio set having one part with adjustable means and a stationary finger portion thereon, means including a second part for releasably locking said adjustable means in an adjusted position, movably carried on said one part between said adjustable means and finger means, an operating part for moving said second part into releasable locking engagement with said adjustable means, and means movably supporting said operating part within said finger portion for pivotal movement across said finger portion.

20. In a station-tuning structure for a radio set, a push button slidable structure including a finger portion and an adjustable setting device, the said structure having two parts slidably interconnected, and a pivoted lever pivotally connected with one part and adapted to act on the other part to place said other part in locking engagement with said setting device at a station tuning position, said lever being pivotally movable within said finger portion, and station indicating means removably supported on said finger portion in the path of movement of said lever, said lever, on movement thereof permitting a release of said adjustable setting device, engaging said station indicating means to move the same from said finger portion.

21. In a control unit which includes movable carriage means, push button means fixedly supported by said carriage means and operative to move said carriage means and a control element adjustably supported by said carriage means for movement therewith; the means for locking said control element against movement relative to said carriage means which includes a lever, and means pivotally supporting said lever in a position such that it is accessible for actuation at a point adjacent the outside of said push button means without movement of said push button means relative to said carriage means or removal of said push button means from said carriage means.

22. In a control unit which includes a carriage member, a push button member fixedly supported at one end portion of said member, means supporting said member for movement in response to actuation of said push button member and a control element adjustably supported along said carriage member at a point removed from said one end thereof for movement therewith; the means for locking said control element against movement relative to said carriage member which includes a lever, and means pivotally supporting said lever upon one of said members, said lever being at least partially disposed within a recessed portion of said push button member and being accessible for actuation from the outside of said push button member without movement of said push button member relative to said carriage member and without removal of said push button member from said carriage member.

23. In a control unit comprising a movable carriage member and a control element adjustably supported along said member at a point removed from one end thereof and movable therewith; the combination which includes a push button fixedly supported at said one end of said member, a lever pivotally supported at a point along said carriage member and provided with a portion extending through an apertured portion of said push button to project outwardly from one wall of said push button, and a part extending longitudinally of said member to operatively connect said control element and said lever so that said control element is releasably held against movement relative to said member in response to movement of said lever within the apertured portion of said push button.

24. A control unit for controllable apparatus, comprising a carriage member, a hollow push button fixedly supported at one end of said member, means supporting said member for movement between two positions in response to finger actuation of said push button, a control element adjustably supported along said member at a point removed from said one end thereof, a lever supported for pivotal movement substantially within the confines of the hollow portion of said push button and provided with a portion extending through the front wall of said push button, and a part extending longitudinally of said body part to operatively connect said control element and said lever so that said control element is releasably held against movement relative to said member in response to pivotal movement of said lever substantially within the confines of the hollow portion of said push button.

25. A control unit for controllable apparatus, comprising a movable carriage member, a push button fixedly supported at one end portion of said member, a control element adjustably supported by said member, means including a lever for releasably locking said control element against movement relative to said member, and means for pivotally mounting said lever at a point along said one end portion of said member in a position such that it is accessible for actuation from the outside of said push button without removal of said push button from said member.

26. A control unit for controllable apparatus, comprising a movable carriage member, a push button supported at one end of said member, a control element adjustably supported by said member, means including a pivotally supported lever for releasably locking said control element against movement relative to said member, and a tab removably supported upon one wall of said push button to be engaged by said lever when said lever is moved to release said control element.

27. In a tuning device of the push button type which includes frame means, a control unit slidably supported upon said frame means and comprising, in combination, a body member, a push button fixedly supported at one end of said body member, a control element adjustably supported upon said member, the vertical height and width of said control unit not exceeding the corresponding dimensions of said push button, a lever supported for pivotal movement at a point adjacent said one end of said member, said push button having an aperture therein for receiving at least a portion of said lever, means including one wall portion of said push button for limiting the pivotal movement of said lever so that the end thereof which is furthest removed from the lever pivot point describes an arc not substantially exceeding one of the dimensions of said push button, and means including said lever for releasably locking said control element against movement relative to said member.

28. In a tuning device of the push button type which includes frame means, a control unit slidably supported upon said frame means and comprising, in combination, a body member, a push button supported at one end of said body member, a control element adjustably supported upon said member, the vertical height and width of said control unit not exceeding the corresponding dimensions of said push button, said push button being provided with an opening therein, a lever supported for pivotal movement within said opening, portions of said push button acting to limit the pivotal movement of said lever so that the end thereof which describes the longest arc cannot be moved a distance substantially exceeding one of the dimensions of said push button, and means including said lever for releasably locking said control element against movement relative to said member.

29. In a radio tuning control unit having movable carriage means and an adjustable element thereon; the means for holding the adjustable element on the carriage means in an adjusted position including in combination a lever on the unit adapted for direct finger engagement, means pivotally mounting said lever in position for direct finger engagement at one end of the control unit, and a push button on said control unit at said one end for moving the control unit, and with the finger-engageable lever being movable relative to the push button for applying or releasing a force to hold or release the adjustable element, with the push button remaining in position on the carriage means.

ALEXANDER W. PLENSLER.